(12) United States Patent
Reiderman et al.

(10) Patent No.: US 11,531,135 B2
(45) Date of Patent: Dec. 20, 2022

(54) METHOD OF IMAGING USING AZIMUTHALLY RESOLVED NMR WHILE DRILLING

(71) Applicant: Halliburton Energy Services, Inc., Houston, TX (US)

(72) Inventors: Arcady Reiderman, Richmond, TX (US); Songhua Chen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 63 days.

(21) Appl. No.: 17/025,577

(22) Filed: Sep. 18, 2020

(65) Prior Publication Data
US 2022/0091295 A1 Mar. 24, 2022

(51) Int. Cl.
| | | |
|---|---|---|
| *G01V 3/32* | (2006.01) | |
| *G01R 33/38* | (2006.01) | |
| *G01R 33/36* | (2006.01) | |
| *G01R 33/50* | (2006.01) | |
| *G01N 24/08* | (2006.01) | |
| *G01R 33/44* | (2006.01) | |
| *G01R 33/561* | (2006.01) | |

(52) U.S. Cl.
CPC .............. *G01V 3/32* (2013.01); *G01N 24/081* (2013.01); *G01R 33/3678* (2013.01); *G01R 33/3808* (2013.01); *G01R 33/445* (2013.01); *G01R 33/50* (2013.01); *G01R 33/5617* (2013.01)

(58) Field of Classification Search
CPC .... G01V 3/32; G01N 24/081; G01R 33/3678; G01R 33/3808; G01R 33/445; G01R 33/50; G01R 33/5617
See application file for complete search history.

(56) References Cited

U.S. PATENT DOCUMENTS

| 5,705,927 A | 1/1998 | Sezginer et al. |
| 5,977,768 A | 11/1999 | Sezginer et al. |

(Continued)

FOREIGN PATENT DOCUMENTS

GB  2363848 A  *  1/2002  ........... G01N 24/081

OTHER PUBLICATIONS

PCT Application Serial No. PCT/US2020/051937, International Search Report, dated May 7, 2021, 4 pages.

(Continued)

*Primary Examiner* — Rishi R Patel
(74) *Attorney, Agent, or Firm* — Delizio, Peacock, Lewin & Guerra

(57) ABSTRACT

A nuclear magnetic resonance (NMR) sensor and methods and systems for use are provided. The method comprises disposing a nuclear magnetic resonance (NMR) sensor into a borehole, the NMR sensor comprising a magnet assembly to create a static magnetic field and a first transversal-dipole antenna having an azimuthally selective response function. The method further comprises, while rotating the NMR sensor, initiating azimuthally selective NMR excitation in at least one sensitivity region at a first frequency using the first transversal-dipole antenna and the magnet assembly, wherein the at least one sensitivity region is determined by the static magnetic field and the RF magnetic field. The method then comprises acquiring one or more azimuthally selective NMR signals at the first frequency using the first transversal-dipole antenna.

19 Claims, 9 Drawing Sheets

(56) References Cited

U.S. PATENT DOCUMENTS

| | | | |
|---|---|---|---|
| 6,255,817 B1 | 7/2001 | Poitzsch et al. | |
| 6,326,784 B1 | 12/2001 | Ganesan et al. | |
| 6,373,248 B1 | 4/2002 | Poitzsch et al. | |
| 7,295,005 B2 | 11/2007 | Edwards | |
| 9,377,557 B2* | 6/2016 | Reiderman | G01N 24/081 |
| 10,197,698 B2* | 2/2019 | Reiderman | G01N 24/081 |
| 10,222,505 B2* | 3/2019 | Reiderman | G01R 33/34053 |
| 10,330,816 B2 | 6/2019 | Paulsen et al. | |
| 10,768,334 B2* | 9/2020 | Jachmann | G01R 33/44 |
| 10,782,445 B2* | 9/2020 | Chen | G01R 33/3808 |
| 2002/0140424 A1 | 10/2002 | Reiderman et al. | |
| 2004/0124837 A1* | 7/2004 | Prammer | G01N 24/081 |
| | | | 324/303 |
| 2015/0061665 A1* | 3/2015 | Reiderman | G01N 24/081 |
| | | | 324/303 |
| 2016/0238734 A1 | 8/2016 | Valori et al. | |
| 2017/0242152 A1 | 8/2017 | Chen et al. | |
| 2018/0252839 A1* | 9/2018 | Knizhnik | G01R 33/3808 |
| 2020/0217192 A1 | 7/2020 | Li et al. | |

OTHER PUBLICATIONS

PCT Application Serial No. PCT/US2020/051937, International Written Opinion, dated May 7, 2021, 6 pages.

\* cited by examiner

METHOD OF IMAGING USING AZIMUTHALLY RESOLVED NMR WHILE DRILLING

TECHNICAL FIELD

The disclosure generally relates to the field of formation evaluation and to nuclear magnetic resonance (NMR) imaging while drilling.

BACKGROUND

Various logging techniques are used to evaluate a subsurface formation having one or more formation beds. These can include logging with a tool suspended in an already drilled borehole or can include logging performed while drilling the borehole. Logging, generally, can include logging while drilling (LWD) and measurement while drilling (MWD). One logging technique involves using one or more NMR tools. NMR tools measure NMR properties averaged over the circumference of the sensitivity region created by the tool inside the subsurface formation. In horizontal, near horizontal, and deviated boreholes running along a boundary between two formation beds with different producible porosities, it can be difficult to obtain an informative tool reading.

BRIEF DESCRIPTION OF THE DRAWINGS

Embodiments of the disclosure may be better understood by referencing the accompanying drawings.

DESCRIPTION OF EMBODIMENTS

The description that follows includes example systems, methods, techniques, and program flows that embody embodiments of the disclosure. However, it is understood that this disclosure may be practiced without these specific details. For instance, this disclosure refers to drilling systems and logging systems in illustrative examples. Embodiments of this disclosure can be also applied to different downhole systems. In other instances, well-known instruction instances, protocols, structures, and techniques have not been shown in detail in order not to obfuscate the description.

Overview

Logging in deviated, horizontal, and near horizontal wells would benefit from ability of the NMR system to have an azimuthal selectivity. In particular, azimuthally resolved NMR measurements can improve readings when an NMR sensor is located along a boundary between two formation beds with different producible porosities. Also, a radial resolution of measurements at different radii may give an indication of possible borehole fluids penetration into porous space, which may offer additional formation characterization information. Implementation of azimuthally and radially resolved NMR measurements while drilling is especially advantageous, e.g., using the measurements for geosteering.

The NMR sensor disclosed herein allows for azimuthally selective excitation of an NMR signal with excitation/detection sequence timing related to angular position and velocity of rotating a rotating logging tool, e.g., e.g., an LWD rotated by a drill collar or a wireline tool rotated with one or more motors. In one or more embodiments, the NMR sensor combines azimuthally selective NMR measurements with radial NMR imaging. The NMR sensor can also combine azimuthally resolved NMR measurements and azimuthally averaged NMR measurements in a single sensor or single logging tool. In addition, a forced recovery radio frequency (RF) pulse can be used with the NMR sensor to accelerate azimuthally selective NMR measurements with the NMR sensor.

Example Illustrations

Figure 1:
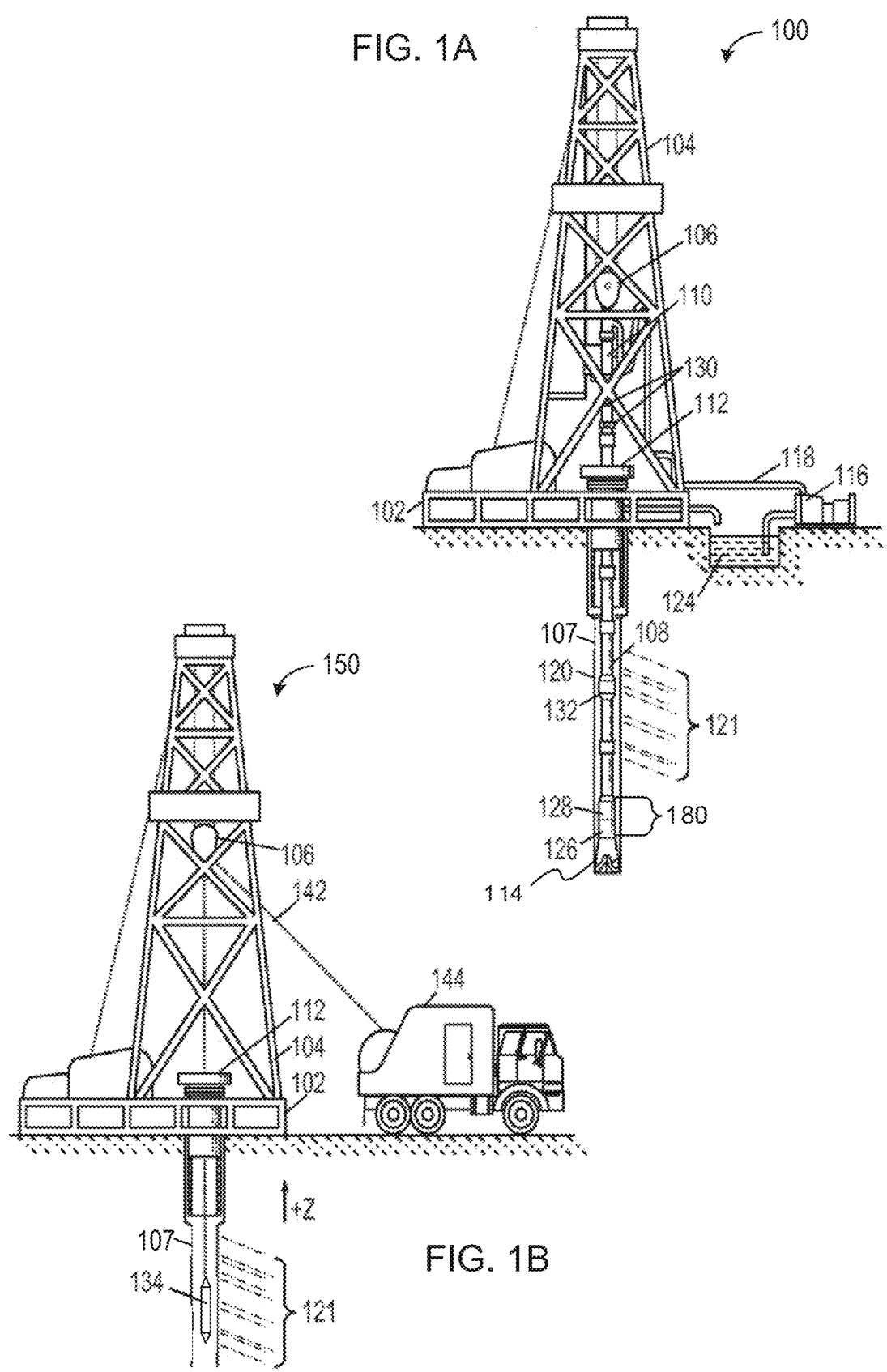
FIG. 1A depicts an illustrative drilling system, according to one or more embodiments.
FIG. 1B depicts an illustrative logging system, according to one or more embodiments.

FIG. 1A depicts an illustrative drilling system 100, according to one or more embodiments. A drilling platform 102 supports a derrick 104 having a traveling block 106 for raising and lowering a drill string 108 into a borehole 107. Although the borehole 107 is shown as vertical for the sake of simplicity, it should be understood that the borehole 107 can be deviated from vertical, i.e., angled, near-horizontal, and horizontal. For example, the borehole 107 can be drilled to stay within one or more beds of a downhole formation. A top drive 110 supports and rotates the drill string 108 as the string is lowered through a well head 112. The drill string's rotation (and/or a downhole motor) drives a drill bit 114 to extend the borehole 107 through subsurface earth formations 121. Mud recirculation equipment 116 draws drilling fluid from a retention pit 124 and pumps it through a feed pipe 118 to top drive 110, through the interior of drill string 108 to the drill bit 114, through orifices in drill bit, through the annulus around drill string 108 to a blowout preventer at the surface, and through a discharge pipe into the pit 124. The drilling fluid transports cuttings from the borehole 107 into the pit 124 and aids in maintaining the integrity of the borehole 107.

At least one logging or LWD tool 126 are integrated into a bottomhole assembly (BHA) 180 near the bit 114. Suitable logging tools include formation fluid sampling tools, acoustic logging tools, electromagnetic resistivity tools, and one or more NMR tools or sensors, among others. As the bit 114 extends the borehole 107 through the formations 121, the LWD tool 126 collects measurements of formation characteristics. Other tools and sensors can also be included in the BHA 180 to gather measurements of various drilling parameters such as position, orientation, weight-on-bit (WOB), borehole diameter, etc. The other tools and sensor, optionally in conjunction with the LWD tool 126, can for MWD tool or system that can provide measurements that can be used to adjust or control the drilling process, such as the direction, WOB, rate of penetration, etc., or a combination thereof. Control/telemetry module 128 collects data from the various BHA instruments (including position and orientation information) and stores them in internal memory. Selected portions of the data can be communicated to surface receivers 130 by, e.g., mud pulse telemetry. Other logging-while drilling telemetry methods also exist and could be employed. For example, electromagnetic telemetry or through-wall acoustic telemetry can be employed with an optional repeater 132 to extend the telemetry range. As another example, the drill string 108 could be formed from wired drill pipe that enables waveforms or images to be transmitted to the surface in real time to enable quality control and processing to optimize the logging resolution. Most telemetry systems also enable commands to be communicated from the surface to the control and telemetry module to configure the operation of the tools.

At various times during the drilling process, the drill string 108 may be removed from the borehole 107 to allow for further logging operations. For example, FIG. 1B depicts an illustrative logging system 150, according to one or more embodiments. Once the drill string has been removed, logging operations can be conducted using at least one logging tool 134. The logging tool 134 may be suspended by a conveyance 142. Conveyance 142 may include any suitable means for providing mechanical conveyance for logging tool 134, including, but not limited to, wireline, slickline, coiled tubing, pipe, drill pipe, downhole tractor, or the like. In some embodiments, conveyance 142 may provide mechanical suspension, as well as electrical connectivity, for logging tool 134. Conveyance 142 may comprise, in some instances, a plurality of electrical conductors extending from a vehicle located at the surface. The conveyance 142 may or may not have conductors for transporting power to the tool and/or telemetry from the tool to the surface. The logging tool 134 can include one or more logging or formation evaluation tools. In one or more embodiments, the logging tool 134 includes one or more NMR sensors. The logging tool 134 can include a mechanism, e.g., one or more motors, to rotate the one or more NMR sensors. A logging facility 144 collects measurements from the logging tool 134 and includes a computer system for processing and storing the measurements gathered by the logging tool 134.

Figure 2:
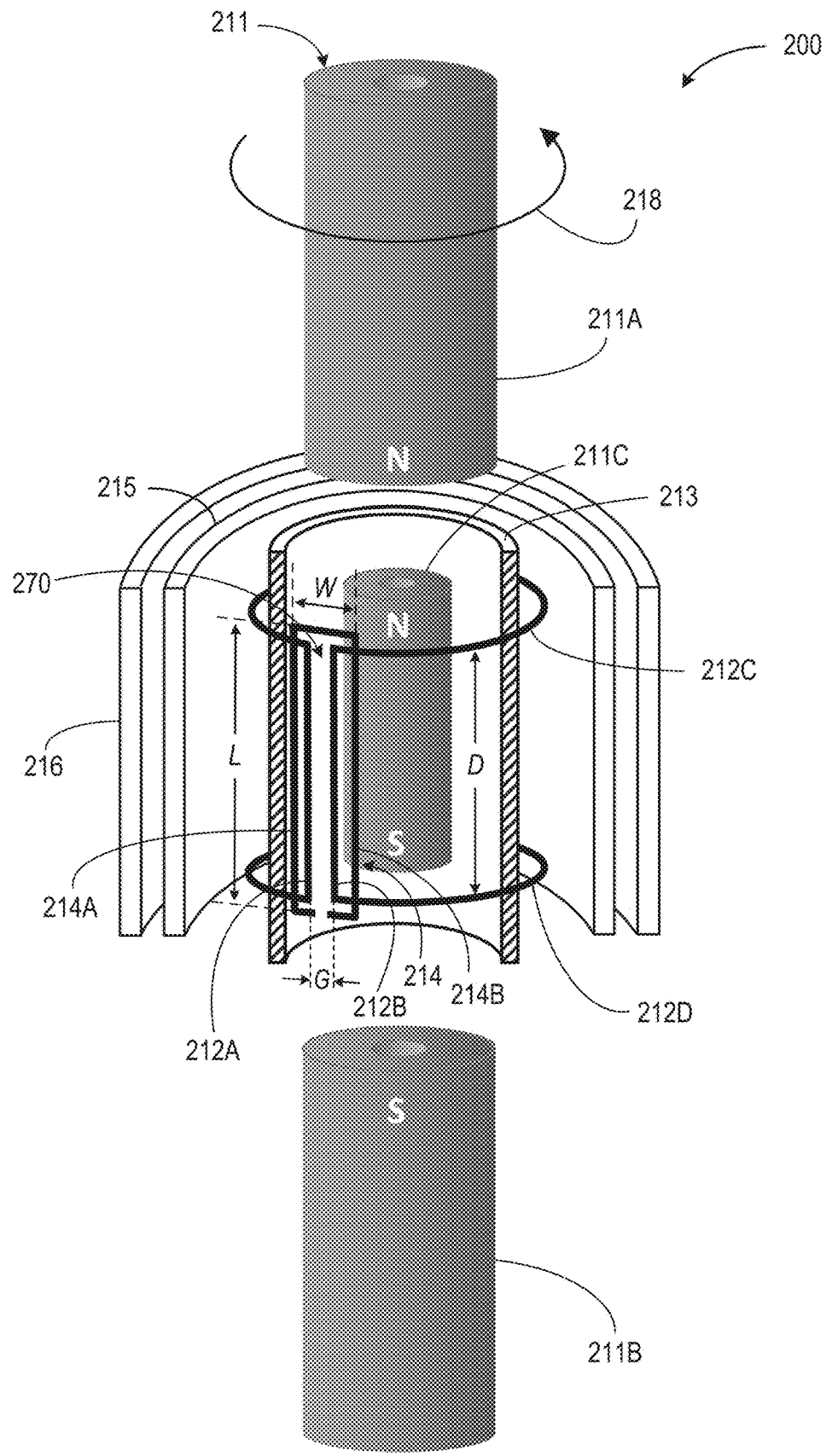
FIG. 2 depicts a schematic diagram of an NMR sensor, according one or more embodiments.

FIG. 2 depicts a schematic diagram of an NMR sensor 200, according one or more embodiments. The NMR sensor 200 can be part of the logging tool 126 as part of an LWD system or can be part of the logging tool 134. The NMR sensor 200 includes a magnet assembly 211 having a first end piece magnet 211A, a second end piece magnet 211B, and a central magnet 211C. The first end piece magnet 211A, the second end piece magnet 211B, and the central magnet 211C can be aligned axially, and the central magnet 211C can be disposed between the first end piece magnet 211A and the second end piece magnet 211B. Further, the poles of the end piece magnets 211A, 211B can correspond to the poles of central magnet 211C. For example, the N pole of the first end piece magnet 211A can face the N pole of the central magnet 211C, and the S pole of the second end piece magnet 211B can face the S pole of the central magnet 211C.

The magnet assembly 211 can generate a static magnetic field in a region of interest, e.g. a longitudinal static magnetic field. The direction of the static magnetic field is parallel to an axis of the borehole 107 and to a central axis of the NMR sensor 200. The configuration of the magnet assembly 211 can be with double pole strength, i.e., where both end piece magnets 211A, 211B and the central magnet 211C are used, to shape the static magnetic field and to increase the strength of the static magnetic field. For example, the static magnetic field can have a field strength of at least 50 Gauss, at least 100 Gauss, or at least 150 Gauss. In one or more embodiments, the static magnetic field can have a field strength between 100 Gauss and 150 Gauss.

The NMR sensor 200 also includes a first antenna 212 and a second antenna 214. Either, or both, of the first antenna 212 and the second antenna 214 can be transceivers. In one or more embodiments, the first antenna 212 is a transversal-dipole antenna having an axially symmetrical response function or at least a substantially axially symmetrical response function to generate a RF magnetic field. The second antenna 214 is a transversal-dipole antenna having an azimuthally selective response function to generate an RF magnetic field, e.g. an azimuthally selective RF field. The first antenna 212 and the second antenna 214 are disposed between the first end piece magnet 211A and the second end piece magnet 211B in an axial direction, and they can be radially aligned with the central magnet 211C. The second antenna 214 can at least partially overlap the first antenna 214.

The first antenna 212 can be at least partially, but not completely, disposed circumferentially around the central magnet 211C. For example, the first antenna 212 can be rectangular shaped and circumferentially wrapped about the central magnet 211C to almost form a cylinder as depicted, i.e., like a saddle coil but wrapping almost all the way around the central magnet 211C. The antenna can have a plurality of turns (2 turns are shown). The first antenna 212 has a first side 212A and a second side 212B that are axially oriented, i.e., parallel with an axial direction of the tool, and substantially parallel with each other, i.e., within 0° to 10° of parallel. In one or more embodiments, the first antenna 212 has a gap 270 between the first side 212A and the second side 212B, i.e. the gap 270 is the separation between the turns of the first antenna. The gap 270 can have a gap width G, i.e., the distance between the first side 212A and the second side 212B. The gap 270 is formed where the first antenna 212 wraps circumferentially about the central magnet but does not completely wrap around thereby leaving the gap 270. The gap width G can be selected to achieve better axial symmetry of the axially symmetrical response function. The first antenna 212 also has a third side 212C and fourth side 212D, both curved to form the top and bottom of the "cylinder" shape, wherein the third side 212C is closer, axially, to the first end piece magnet 211A and the fourth side 212D is closer to the second end piece magnet 211B. In one or more embodiments, the third side 212C and fourth side 212D can be a distance D apart. The distance D can be substantially similar in length to the axial length of the central magnet 211C. For example, the distance D can be up to 10% less than the axial length of the central magnet 211C or can be up to 10% more than the axial length of the central magnet 211C.

The second antenna 214 has a narrow rectangular shape, i.e., shaped as a rectangle having a longer length L axially than its width W. For example, the second antenna 214 can have a first end 214A and a second end 214B both have a length L, wherein the ends 214A, 214B are separated by a width W, where L>W. The ends 214A, 214B are oriented parallel to the axial direction of the NMR sensor 200. In one or more embodiments, the length L is at least 2 times greater than the width W, at least 3 times greater than the width W, at least 4 times greater than the width W, at least 5 times greater than the width W, at least 6 times greater than the width W, or at least 7 times greater than the width W. In one or more embodiments, the length L can be greater than the distance D, and the width W can be greater than the gap width G of the gap 270. For example, the width W can be less than or equal to 40%, less than or equal to 33%, less than or equal to 30%, less than or equal to 25%, less than or equal to 20%, less than or equal to 12.5%, less than or equal to 10%, or less than or equal to 5% of the length of the third side 212C, the fourth side 212D, or both. In one or more embodiments, the length L is less than or equal to the distance D. For example, the second antenna 214 can be assembled, i.e., disposed, in a same radial layer of the sensor 200 and disposed totally in a "window" created by the third side 212C and fourth side 212D of the first antenna, i.e., disposed between the third side 212C and fourth side 212D, with the length L less than the distance D.

In one or more embodiments, the width W is equal to, or substantially equal to, a distance radially to a closest sensitive region or volume. One or more sensitive regions are determined by the static magnetic field and the RF magnetic field of at least one of the first antenna 212 and the second antenna 214. The closest sensitive region is defined by the static magnetic field produced by the magnets (e.g. the first end piece magnet 211A, the second end piece magnet 211B, and/or the central magnet 211C) and the highest frequency of excitation of the RF magnetic field produced by one or more antennas (e.g. first antenna 212, second antenna 214, or both), i.e., the volume defined by the highest frequency of the RF magnetic field that sensitizes a closest radial extent of the static magnetic field.

In one or more embodiments, the second antenna 214 is azimuthally aligned with the gap 270. For example, the gap 270 can be azimuthally aligned between the first end 214A and the second end 214B, as depicted. Aligning the second antenna 214 with the gap 270 can reduce interference between the first antenna 212 and the second antenna 214. In other embodiments, although not shown, the second antenna 214 is not azimuthally aligned with the gap 270. In general, aligning the first antenna 212 and the second antenna 214 to be mutually orthogonal can reduce undesired interference signals.

In one or more embodiments, a soft magnetic core 213 is positioned under the first antenna 212 and the second antenna 214, i.e., radially between the antennas 212, 214 and the central magnet 211C, to increase efficiency of the NMR sensor 200. The soft magnetic core 213 is a layer of soft magnetic core material, e.g., magnetic sleeve. The soft magnetic core 213 can shield all or most of one or more RF fields generated by the first antenna 212 and/or the second antenna 214 away from the conductive components inside the NMR sensor 200. The conductive components may be conductive structural members or the magnet assembly 211 (e.g., the central magnet 211C). The soft magnetic core 213 can also shape the static magnetic field generated by the magnet assembly 211 by smoothing out the longitudinal magnetic field variation. In one or more embodiments the portion of the second antenna 214 between the ends 214A, 214B can have a curvature following the circumferential angle of the central magnet 211C or the soft magnetic core 213. The whole NMR sensor 200, can have a diameter greater than the soft magnetic core 213 and greater than or equal to a diameter of the first antenna 212. The diameter of the NMR sensor 200 can define a circumference of the sensor, i.e. the physical extent radially of the NMR sensor 200. The width W can be less than or equal to 40%, less than or equal to 33%, less than or equal to 30%, less than or equal to 25%, less than or equal to 20%, less than or equal to 12.5%, less than or equal to 10%, or less than or equal to 5% of the circumference of the NMR sensor 200.

In one or more embodiments, the first antenna 212 and the second antenna 214 are used to generate one or more RF magnetic field in the region of interest. A volume of investigation can be made axially long enough and thick enough to provide immunity to both axial and lateral motion of the downhole tool and particularly the NMR sensor. For example, the volume can range from 5 cm to 30 cm long (i.e., in the axial direction) and range from 0.5 cm to 3 cm thick (i.e., radially). In addition, the static magnetic field in the region of interest has a gradient. The gradient, a bandwidth of the RF excitation, the static magnetic field, and a spatial localization of the RF magnetic field determine the shape and position of a first NMR sensitive region or volume 215. Changing the operating RF frequency changes radial position of the sensitive region. For example, a second sensitive region or volume 216 can have a different position of the sensitive region 215 by changing the operating RF frequency. Note, the first antenna 212 and the second antenna 214 can operate at different frequencies or at the same frequency. Within a given frequency range, the sensitive region can be adjusted radially from closer to the antennas to further away from the antennas as the frequency ranges from high to low. For example, first sensitive region 215 can be generated with a high frequency that the frequency used to generate the second sensitive region 216.

Rotation of the NMR sensor 200 (as shown by arrow 218) is used to obtain an azimuthally resolved measurement ("image") of an NMR property of the region of interest. The image is acquired or detected using the second antenna 214 as a transceiver antenna.

Figure 3A:
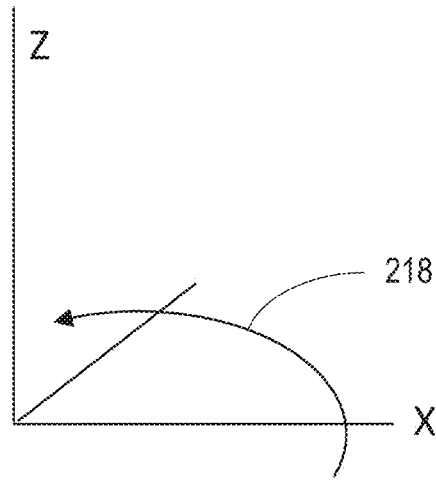
FIG. 3A depicts the rotation of the NMR sensor an XYZ plane, according to one or more embodiments.

FIG. 3A depicts the rotation 218 of the NMR sensor 200 an XYZ plane, according to one or more embodiments. The Z-axis, as depicted represents the axial direction of the NMR sensor 200 (and of the borehole 107). The NMR sensor 200 can be rotated around the Z-axis, e.g., with a motor, and/or by natural motion of the downhole tool, such as while the NMR sensor 200 is deployed while drilling in an LWD operation.

Figure 3B:
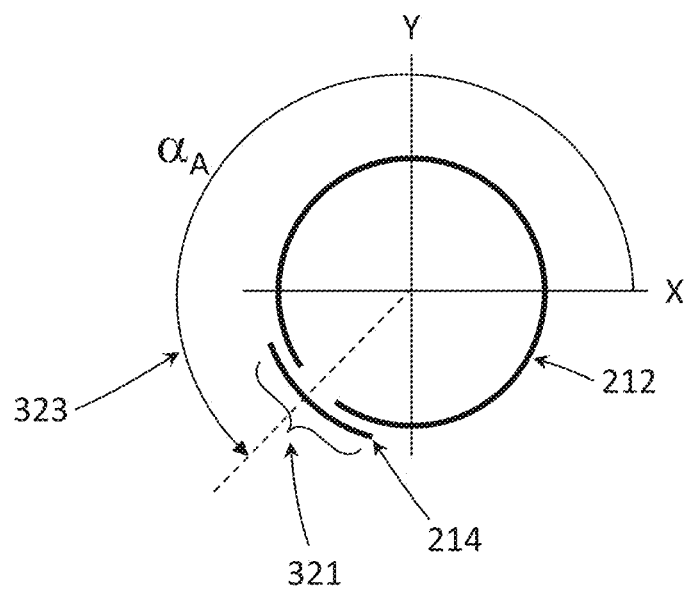
FIG. 3B depicts the rotation of a second antenna in the XY plane, according to one or more embodiments.

FIG. 3B depicts the rotation of the second antenna 214 in the XY plane, according to one or more embodiments. In operation the second antenna 214 has an azimuthally selective antenna aperture $1_A$ (i.e., an azimuthal aperture 321) that, along with some other parameters, defines the azimuthal resolution of measurements by the NMR sensor 200. The antenna aperture $1_A$ correlates to, i.e., is a function of, the width W of the second antenna 214. Other parameters defining the azimuthal resolution include signal-to-noise ratio (SNR) and the radial distance from the antenna to the sensitive region (e.g., sensitive region 215 or sensitive region 216). Angular position $\alpha_A$ (i.e., angular position 323) of the second antenna 214 can be determined from directional measurements, e.g., using one or more magnetometers.

Figure 4:
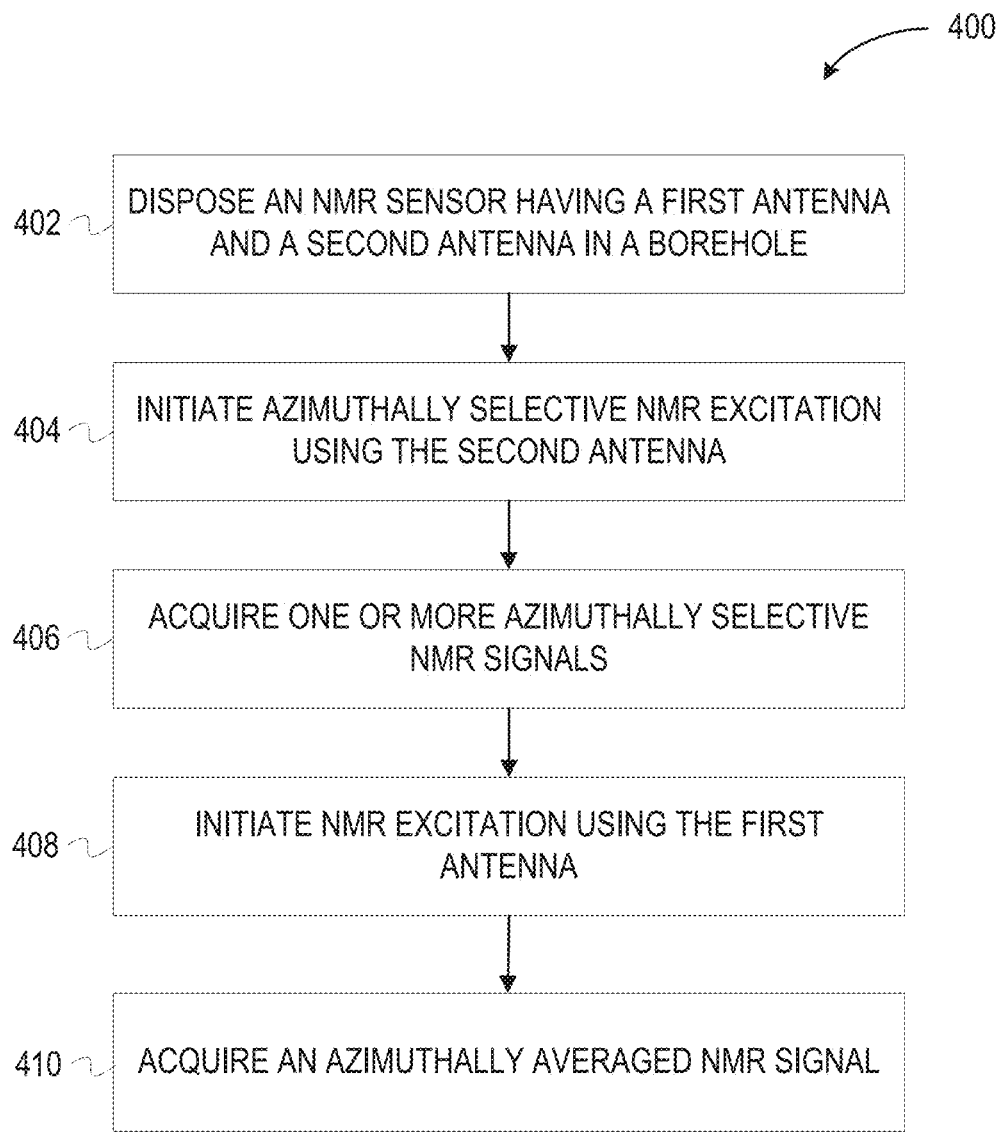
FIG. 4 is a flow chart depicting an example of a method for taking one or more measurements with the NMR sensor, according to one or more embodiments.

FIG. 4 is a flow chart depicting an example of a first method 400 for taking one or more measurements with the NMR sensor 200, according to one or more embodiments. FIG. 4 is annotated with a series of numbered blocks. These numbered blocks represent stages of operations. Although these stages are ordered for this example, the stages illustrate one example to aid in understanding this disclosure and should not be used to limit the claims. Subject matter falling within the scope of the claims can vary with respect to the order and some of the operations.

At block 402, the NMR sensor 200 is disposed into the borehole 107, e.g., as a component of the LWD tool 126 of the drilling system 100 or a component of the logging tool 134 of the logging system 150. In one or more embodiments, the borehole 107 in which the NMR sensor 200 is disposed is a deviated, near horizontal, or horizontal borehole. For example, the NMR sensor 200 can be disposed in the borehole 107 along a boundary between two formation beds, wherein each formation bed has different producible porosities.

At block 404, NMR excitation is initiated via the NMR sensor 200. In one or more embodiments, azimuthally selective NMR excitation can be initiated via the second antenna 214, axial symmetric, i.e., azimuthally averaged, NMR excitation can be initiated via the first antenna 212, or both can occur (see infra). In one or more embodiments, initiating the azimuthally selective NMR excitation includes producing an NMR response function in a selected azimuthal aperture $l_A$.

At block 406, one or more NMR signals are acquired, i.e., detected, via the NMR sensor 200. For example, the first antenna 212 can acquire azimuthally averaged NMR signals, and the second antenna 214 can acquire an azimuthally resolved measurement ("image") of an NMR property of the region of interest. In one or more embodiments, the second antenna 214 can be also used to acquire one or more NMR signals emanating from the nuclear magnetization excited by the first antenna 212. All acquired NMR signals may be used jointly in data processing to improve the accuracy of measurements. When either of the first antenna 212 or the second antenna 214 both excite and acquire signals, they can be referred to as transceivers.

The process of exciting nuclear magnetic resonance and then acquiring a measurement of resulting signal is sometimes referred to as an NMR experiment. NMR experiments can be paused, e.g., while waiting until the nuclear magnetization is recovered to is thermal equilibrium state, or can be repeated, e.g., at different sensitivity regions via different frequencies.

Figure 5:
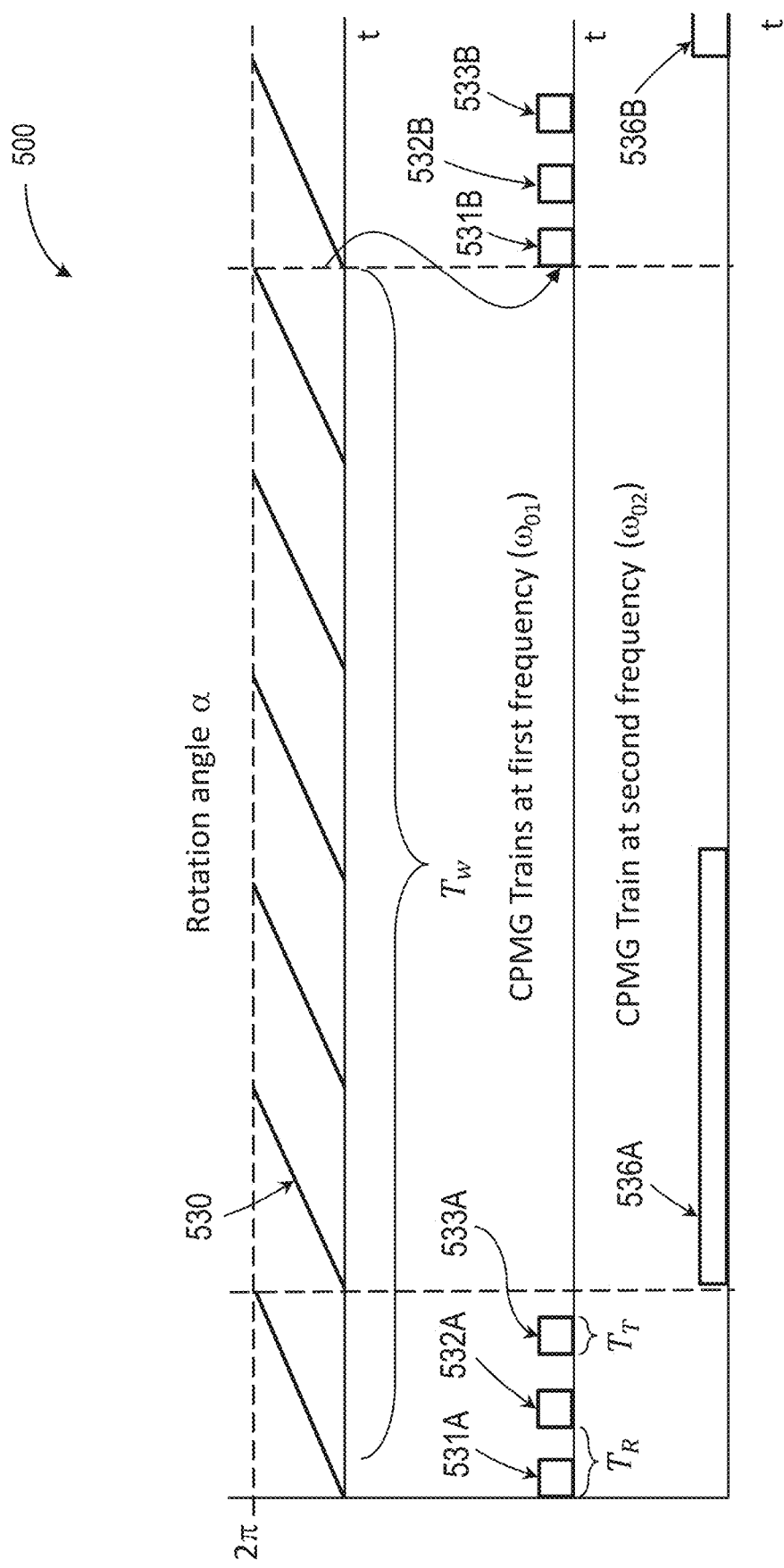
FIG. 5 depicts a timing diagram of measurements acquired with the NMR sensor in a first operational mode, according to one or embodiments.

FIG. 5 depicts a timing diagram 500 of measurements acquired, i.e., detected, with the NMR sensor 200 in a first operational mode (i.e., according to the first method 400), according to one or embodiments. The top portion of the diagram 500 depicts the rotation angle or angular position 530 of the second antenna 214 during a number of consecutive rotation cycles. As shown, the second antenna 214 has a rotation angle α ranging from 0 to 2π (i.e., a full rotation).

Synchronously with the rotation cycles, a series of short CPMG pulse sequences or trains (three trains 531A, 532A, and 533A are shown) is generated during the first full rotation of the NMR sensor 200 at a first frequency cool to excite the formation and produce azimuthally selective NMR signals, i.e., to produce an azimuthally selective response function. Each short CPMG pulse train is a short CPMG sequence of RF pulses. In one or more embodiments, the same pulse train is repeated to form the series, i.e., the trains do not have a different pattern. Although three short CPMG pulse trains are depicted, there can be more than three short CPMG pulse trains or less than three short CPMG pulse trains in a single rotation. In one or more embodiments, the number of short CPMG pulse trains in the series is optimized to have a maximum number of short CPMG pulse trains in a single rotation. For example, the slower the rotation speed, the greater the number of short CPMG pulse trains that can be included in the series.

Likewise, the faster the rotation speed, the lesser the number short CPMG pulse trains that can be included in the series. The number of short CPMG pulse trains determines the number of azimuthal bins. These azimuthal bins are not overlapping. As such, the azimuthal resolution of the NMR sensor 200 can be determined by a combination of the rotation speed, the timing of trains, and/or by the antenna architecture, i.e., the azimuthal aperture 321.

A wait time $T_w$ defines the minimum time needed for the nuclear magnetization to recover to its thermal equilibrium. In one or more embodiments, the wait time $T_w$ is greater than the time needed for the nuclear magnetization to recover to its thermal equilibrium and equals the time from the first excitation pulse to the end of a $n^{th}$ full rotation period. Said differently, while the nuclear magnetization may recover before the end of a particular full rotation, i.e., before the end of the $n^{th}$ rotation, the wait time $T_w$ lasts n–1 full rotations after the first rotation in which the first excitation occurred, e.g., to assure alignment of the measurements azimuthally. For example, as depicted the wait time $T_w$ lasts from the end of the first short CPMG pulse train 531A to the end of the $6^{th}$ full rotation of the NMR sensor 200; i.e., 6 full rotations were required to assure the nuclear magnetization had recovered. In one or more embodiments, n is the smallest number of full rotations that occur until the nuclear magnetization recovers its thermal equilibrium, e.g., to optimize efficiency of measurements.

If the rotation period is shorter than the wait time $T_w$, then new short CPMG pulse trains are not generated until after the wait time $T_w$. In one or more embodiments, the wait time $T_w$ can last for several seconds, e.g., at least 3 seconds to 10 seconds. In one or more embodiments, the wait time $T_w$ is preset or preprogramed based on the anticipated time needed for the nuclear magnetization to recover to its thermal equilibrium. Wait time $T_w$, as shown, is caused by the first train 531A. There would be a similar wait time for the second train 532A and for the third train 533A (and any succeeding trains). As the mentioned above, due to the rotation of the NMR sensor 200 and the azimuthal selectivity of the second antenna 214, the nuclear magnetization caused by the first train 531A does not affect the nuclear magnetization of the second train 532A and third train and 533A.

The main sequence timing parameters for the series of short CPMG pulse trains are the train length $T_T$ (i.e., the length of each train in the series), the train repetition rate or time $T_R$ (i.e., the time between the beginning of a first train in the series until the beginning of a next train in the series), and the number of trains $N_T$ in the series for each NMR measurement cycle. The timing parameters related by Equations 1, 2, & 3, as follows:

$$T_T < \frac{l_A}{r_{SV} \cdot \overline{\omega}} \tag{1}$$

$$T_R > \frac{l_A}{r_{SV} \cdot \omega_R} \tag{2}$$

$$N_T = \frac{2\pi}{\overline{\omega} \cdot T_R} \tag{3}$$

where $l_A$ is the azimuthal aperture (see azimuthal aperture 321 in FIG. 3B), $r_{SV}$ is the radius of the sensitive volume, $\omega_R$ is the instantaneous angular velocity of rotation of the NMR sensor 200, and $\overline{\omega}$ is the average angular velocity of rotation of the NMR sensor 200. As such, the train length $T_T$, the number of trains $N_T$, and the train repetition time $T_R$ are based on the azimuthal aperture $l_A$. Equation 1 ensures that the second antenna 214 does not move much during the CPMG train so the azimuthal resolution remains comparable with the azimuthal aperture $l_A$. For example, the train length $T_T$ can be selected to not extend into a different azimuthal aperture $l_A$. Equation 2 is a requirement needed to guarantee that each consecutive NMR train starts when the second antenna 214 has rotated away from the part of the sensitive volume (sector) exposed to the RF field of the previous train. For example, the train repetition time $T_R$ can be selected so that each train of the series of trains begins in new azimuthal region of the sensitive region, wherein the azimuthal region is based on or defined by the azimuthal aperture $l_A$. Per Equation 3, the number of trains $N_T$ is based on the average angular velocity of rotation $\bar{\omega}$ of the NMR sensor 200, and further based on the train repetition time $T_R$. Thus, the number of trains $N_T$ is selected and/or determined based on the rotation of the NMR sensor such that there is a train in each azimuthal aperture $l_A$ per frequency of excitation for a single rotation from 0 to $2\pi$. In one or more embodiments the number of trains $N_T$ corresponds, e.g., equates, to the number of azimuthal apertures or azimuthal bins or azimuthal regions in a given frequency. The train length $T_T$, the train repetition time $T_R$, and the number of CPMG trains $N_T$ can be selected based on the azimuthal aperture $l_A$, e.g., a selected azimuthal aperture.

The duration of the train series (which is based on the train length $T_T$, the number of CPMG trains $N_T$, and the train repetition time $T_R$) can be selected in relation to the averaged angular velocity $\bar{\omega}$ and/or instantaneous angular rotation $\omega_R$ so that each consecutive train starts when the second antenna 214 is rotated away from the formation sector exposed to the excitation of the RF field of the previous train. For example, as the NMR sensor 200, and therefore the second antenna 214 rotate, each new train the series of short CPMG trains can start in a new azimuthal aperture $l_A$, i.e., the excitation pulse train is timed, by adjusting train length $T_T$ and/or train repetition time $T_R$, to excite only that azimuthal angle and thus that specific azimuthal aperture $l_A$. In one or more embodiments, the number of CPMG trains $N_T$, corresponds to the number of azimuthally selective regions excited by the second antenna 214, wherein the dimensions of the azimuthally selective regions are based on the azimuthal aperture $l_A$.

After a pause equal to the wait time $T_w$, a new series of short CPMG trains (three short CPMG trains 531B, 532B, 533B are shown) is generated again, e.g., at the first frequency. As above, the number of trains in the new series can vary depending on the rotation speed and the desired number of azimuthal bins. The NMR signals generated in consecutive series of trains can be used for the data stacking (to increase SNR) or/and to interrogate different sectors (different angular positions) of the sensitive region.

In addition, in one or more embodiments, the first antenna 212 is used to excite (at block 408) and acquire, i.e., detect, (at block 410) an azimuthally averaged NMR signal with higher SNR than the SNR of the azimuthally selective signal detected with the second antenna 214. Because first antenna 212 integrates a signal from all the potentially sensitive region while the second antenna 214 only integrates a signal from the a sector of the potentially sensitive region (i.e. each azimuthal sector or region excited by the second antenna 214), the NMR signal is stronger and, therefore, the SNR of the azimuthally averaged NMR signal is higher than the SNR of the azimuthally selective NMR signal. A long CPMG train (two long CPMG trains 536A, 536B are shown), i.e., sufficiently long to represent all relaxation spectrum components in the sample, can be used to generate or excite the averaged NMR signal to be acquired. The first antenna 212 and the second antenna 214 can be mutually orthogonal to reduce undesired interference signals between the short CPMG trains and the long CPMG trains. Further, the long CMPG trains are initiated during a wait time $T_w$. In one or more embodiments, the long CMPG trains are initiated after the first full rotation of the NMR sensor 200, as depicted, and before the end of the wait time $T_w$, so there is less (or no) interference with the short CPMG trains. For example, as depicted, a first long CPMG train 536A is initiated after the first rotation and after the third short CPMG train 533A. However, in one or more embodiments, the long CMPG train is initiated before the first full rotation of the NMR sensor 200 has ended but not during the pulse of a short CPMG train. In another embodiment, the long CMPG train is initiated at a second frequency, before the first full rotation of the NMR sensor 200 has ended, and during a pulse of a short CPMG train. The long CPMG trains can extend over one or more rotations of the NMR sensor 200.

In one or more embodiments, the azimuthally averaged NMR signal is acquired at a different sensitivity region (i.e., at a different or second frequency $\omega_{02}$) during the wait time $T_w$. Switching the frequency can switch or move the radial volume, e.g., moving it radially in or out. Having the short and long CPMG trains at different frequencies also further differentiates the acquired NMR signals by helping to differentiate from the azimuthally selective NMR signal(s) and the azimuthally averaged NMR signals.

Figure 6:
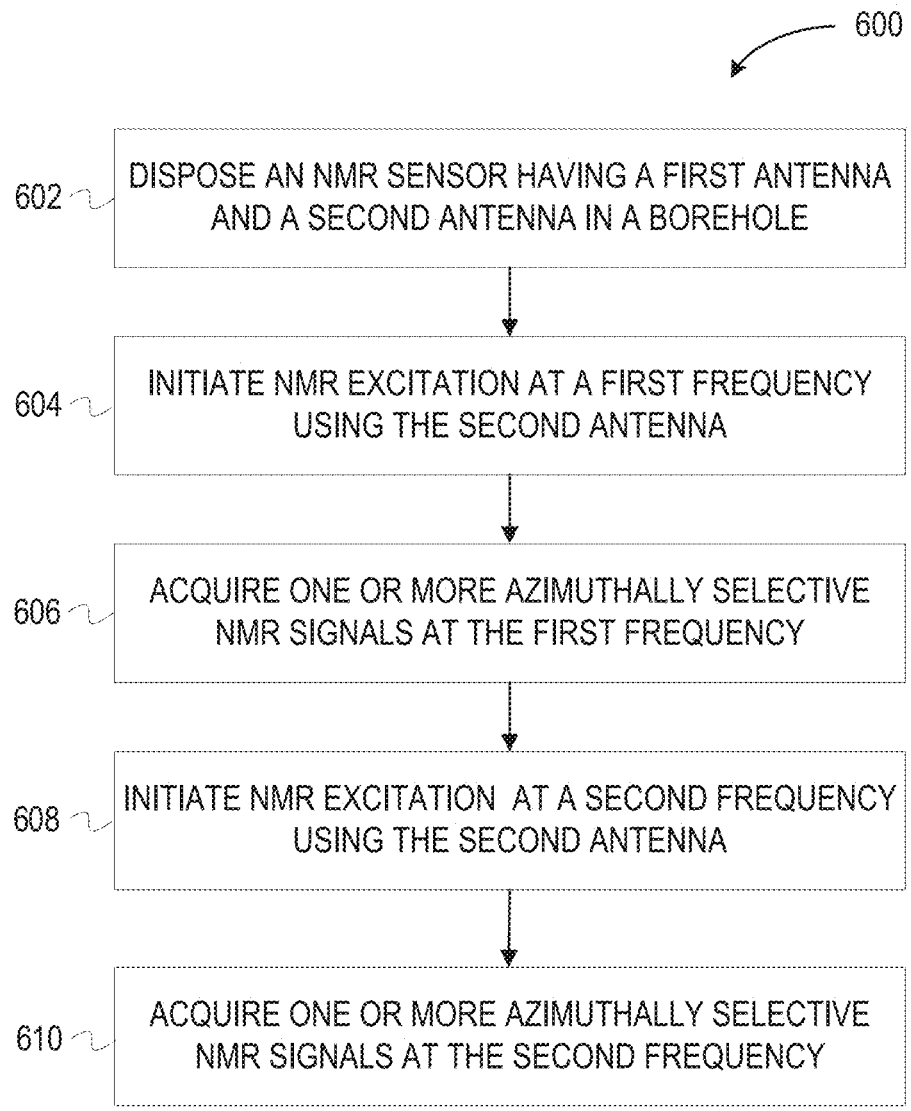
FIG. 6 is a flow chart depicting an example of a second method for taking one or more measurements with the NMR sensor, according to one or more embodiments.

FIG. 6 is a flow chart depicting an example of a second method 600 for taking one or more measurements with the NMR sensor 200, according to one or more embodiments. FIG. 6 is annotated with a series of numbered blocks that represent stages of operations. Although these stages are ordered for this example, the stages illustrate one example to aid in understanding this disclosure and should not be used to limit the claims. Subject matter falling within the scope of the claims can vary with respect to the order and some of the operations.

At block 602, the NMR sensor 200 is disposed in the borehole 107 as described in block 402 of FIG. 4. Similar, to block 404 of the first method 400, at block 604, NMR excitation is initiated via the NMR sensor 200 at a first frequency. At block 606, one or more NMR signals are acquired at the first frequency.

Figure 7:
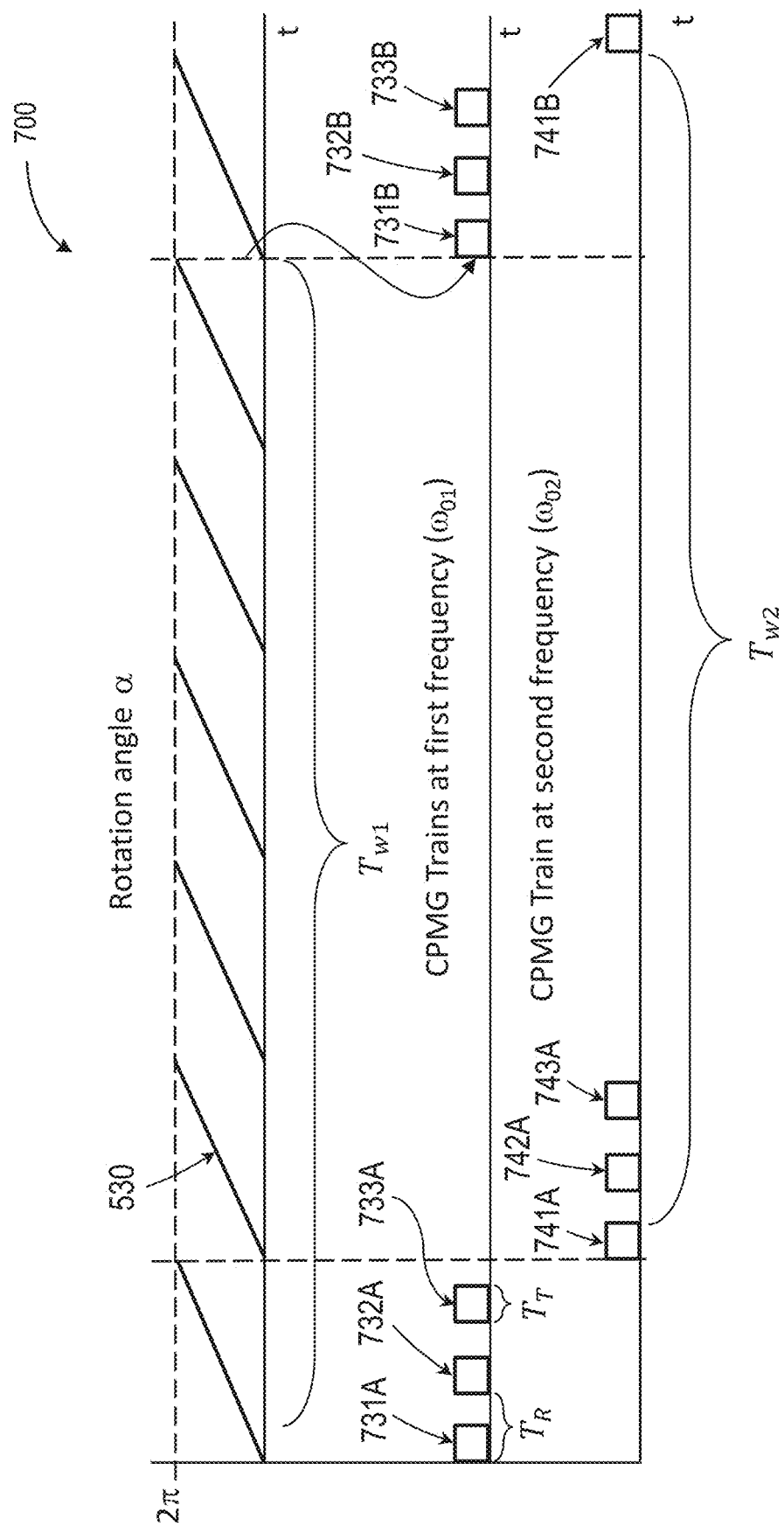
FIG. 7 depicts a timing diagram of measurements taken with the NMR sensor in a second operational mode, according to one or embodiments.

FIG. 7 depicts a timing diagram 700 of measurements acquired with the NMR sensor 200 in a second operational mode (i.e., according to the second method 600), according to one or embodiments. Like the timing diagram 500 in FIG. 5, the top portion of the diagram 700 depicts the rotation angle or angular position 530 of the second antenna 214 during a number of consecutive rotation cycles. As shown, the second antenna 214 has a rotation angle $\alpha$ ranging from 0 to $2\pi$ (i.e., a full rotation).

Synchronously with the rotation cycles, a first series of short CPMG pulse trains (three trains 731A, 732A, and 733A are shown) is generated with the second antenna 214 during the first full rotation cycle at a first frequency $\omega_{01}$ to excite the formation and produce azimuthally selective NMR signals in a first sensitivity region. In one or more embodiments, the same pulse train is repeated to form the series, i.e., the trains do not have a different pattern. Although three short CPMG pulse trains are depicted, there can be more than three short CPMG pulse trains or less than three short CPMG pulse rains in a single rotation. In one or more embodiments, the number of short CPMG pulse trains in the series is optimized to have a maximum number of short CPMG pulse trains in a single rotation. For example, the slower the rotation speed, the greater the number of short CPMG pulse trains that can be included in the series. Likewise, the faster the rotation speed, the lesser the number short CPMG pulse trains that can be included in the series. The number of short CPMG pulse trains determines the number of azimuthal bins. These azimuthal bins are not overlapping. As such, the azimuthal resolution of the NMR sensor 200 can be determined by a combination of the rotation speed, the timing of trains, and/or by the antenna architecture, i.e., the azimuthal aperture 321.

As in the first method 400 and described by timing diagram 500, if the rotation period is shorter than a first wait time $T_{w1}$ needed for the nuclear magnetization to recover to its thermal equilibrium, then the short CPMG pulse trains for the first frequency $\omega_{01}$ are not generated until after the recovery time. For example, the first wait time $T_{w1}$ can last for several seconds, e.g., at least 3 seconds to 10 seconds. In one or more embodiments, the first wait time $T_{w1}$ is preset or preprogramed based on the anticipated time needed for the nuclear magnetization to recover to its thermal equilibrium. In one or more embodiments, the there are multiple wait times that are the same time period as the first wait time $T_{w1}$. For example, a second wait time $T_{w2}$ and a third wait time $T_{w3}$ can have the same time period as the first wait time $T_{w1}$.

The same timing parameters, e.g., the train length $T_T$, the train repetition time $T_R$, and the number of CPMG trains $N_T$, and relationships therebetween discussed above with respect to timing diagram 500 apply to the short CPMG pulse trains in timing diagram 700 for the second method 600.

The first wait time $T_{w1}$, as shown, is caused by the first train 531A. There would be a similar wait time for the second train 732A and for the third train 733A (and any succeeding trains). As the mentioned above, due to the rotation of the NMR sensor 200 and the azimuthal selectivity of the second antenna 214, the nuclear magnetization caused by the first train 731A does not affect the nuclear magnetization of the second train 732A and third train and 733A. As with the first method 400, the duration of the train series can be selected in relation to the averaged angular velocity $\bar{\omega}$ and/or instantaneous angular rotation $\omega_R$ so that each consecutive train starts when the second antenna 214 is rotated away from the formation sector exposed to the excitation at the first frequency of the RF field of the previous train.

After a pause equal to the first wait time $T_{w1}$, a new first series of short CPMG trains (three short CPMG trains 731B, 732B, 733B are shown) is generated at the first frequency again. As above, the number of trains in the new first series can vary depending on the rotation speed and the desired number of azimuthal bins. The NMR signals generated in consecutive series of trains can be used for the data stacking (to increase SNR) or/and to interrogate different sectors (different angular positions) of the sensitive region.

At blocks 608 and 610 of second method 600, and as depicted in timing diagram 700, in one or more embodiments, a second series of short CPMG pulse trains (three trains 741A, 742A, and 743A are shown) is generated using the second antenna 214 at a second frequency $\omega_{02}$ to excite the formation and produce azimuthally selective NMR signals in a second sensitivity region. The second series generated at the second frequency $\omega_{02}$ can occur during any portion of the first wait time $T_{w1}$. For example, as depicted, second series generated at the second frequency $\omega_{02}$ and acquired during the second rotation of the NMR sensor 200.

In other embodiments, the second series can be generated at the second frequency $\omega_{02}$ and acquired during a different rotation, e.g., the third rotation, fourth rotation, fifth rotation, etc., ideally before the end of the first wait time $T_{w1}$.

Although not show, in one or more embodiments, more than two frequencies can be used to generate more than two series of short CPMG pulse trains at varying frequencies, thus allowing the azimuthally selective NMR excitation and acquisition to be multi-frequency. For example, a third, fourth, and/or fifth series of short CPMG pulse trains can be generated at a third, fourth, and/or fifth frequencies, respectively, all during the first wait time $T_{w1}$ resulting from the first series of short CPMG pulse trains. As the frequency of the pulse trains determines the radial extent of the sensitive region of an azimuthal image, acquiring azimuthal images at each frequency produces a radial image in addition. (See e.g., sensitivity volumes 215 and 216 in FIG. 2 depicting the effect the radial extant with varied frequency.) Thus, this radial image is a radially resolved measurement.

In addition, by generating the second (or more) frequencies during the first wait time $T_{w1}$ improves the efficiency of the NMR measurements by eliminating "down time" resulting from the need for the nuclear magnetization to recover its thermal equilibrium, and thus increases the NMR data rate to the surface while the NMR sensor 200 is deployed. In other words, a richer NMR data set can be acquired using trains at different frequencies than if the measurements were only conducted at a single frequency.

After a pause equal to a second wait time $T_{w2}$, which can be the same time period as the first wait time $T_{w1}$, a new second series of short CPMG trains (only the first short CPMG train 741B is shown) is generated at the second frequency $\omega_{02}$ again. As above, the number of trains in the new second series can vary depending on the rotation speed and the desired number of azimuthal bins. The NMR signals generated in consecutive series, e.g., the new second series, of trains can be used for the data stacking (to increase SNR) or/and to interrogate different sectors (different angular positions) of the sensitive region.

Note, for both the first method 400 and the second method 600, the process indicated by the timing diagrams 500 and 700, respectively, can be repeated multiple times at the same depth in the borehole 107, i.e., at the same axial region. For example, the NMR experiments of methods 400 and 600 can be repeated 2 times, 3 times, 4 times, 5 times, 6 times, 7 times, and so on in the same axial region. Repeating the NMR experiments in the same axial region can improve the SNR of the NMR signal over the axial region.

Although not depicted it is also possible to combine both the first method 400 and the second method 600 following the same constraints. For example, a first series of short CPMG pulse trains could be acquired at a first frequency with the second antenna 214, a second series of short CPMG pulse trains could be acquired at a second frequency with the second antenna 214, and a long CPMG train could be acquired at a third frequency, the second series being acquired before the end of the wait time of the first series.

One way to even further improve both methods above is to reduce the wait time caused by each short CPMG pulse train. Waiting for the nuclear magnetization to recover before starting the next series of trains (e.g., the series 531B, 532B and 533B in FIG. 5 or the series 731B, 732B and 733B in FIG. 7) makes the measurements longer and therefore can affect the dynamic axial resolution of measurements, especially when an azimuthal and radial imaging are targeted. To reduce the waiting time, a modified NMR sequence (i.e., a modified NMR train) with a forced recovery pulse can be used.

Figure 8:
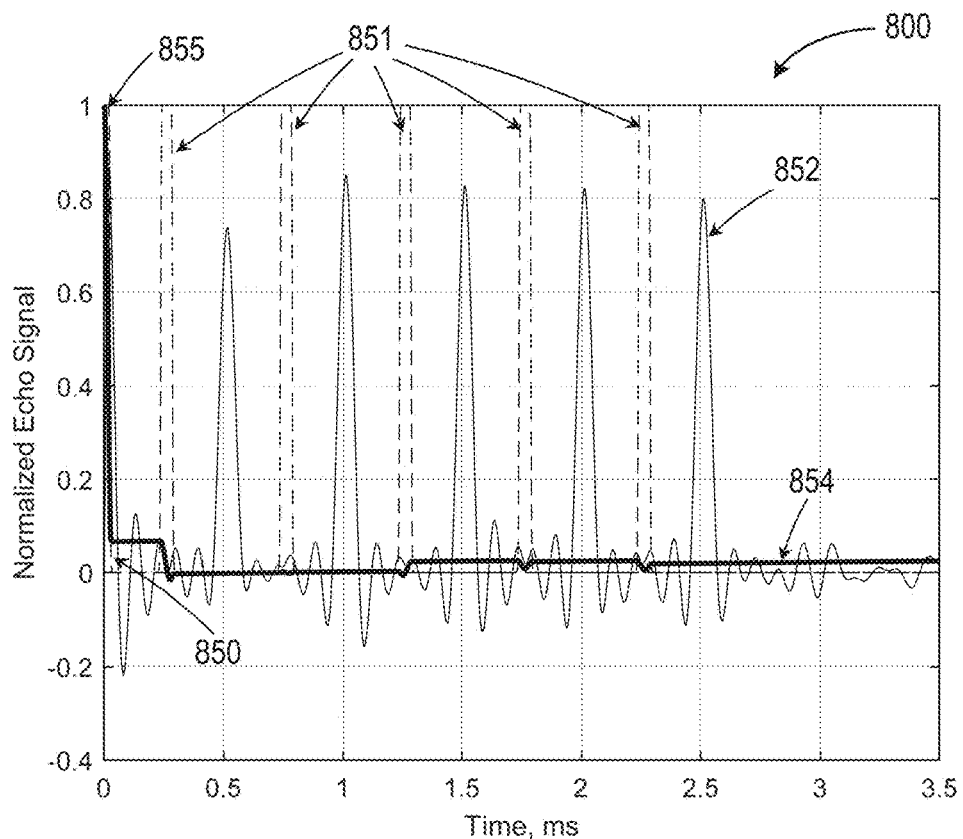
FIG. 8 depicts a numerical simulation of a single NMR echo train, according to one or more embodiments.

FIG. 8 depicts a numerical simulation of an NMR echo signal for a single short CPMG pulse train 800, according to one or more embodiments. For example, the pulse train 800 could be any of the short CPMG pulse trains depicted in FIG. 5 or 7. The pulse train 800 includes an excitation pulse 850 and one or more refocusing pulses 851 (five refocusing pulses are shown). Also depicted are a spin echo signal 852 in a main channel and a longitudinal magnetization signal 854 (the magnetization in the direction of the static magnetic field), both resulting from (i.e., generated from) the pulse train 800. In FIG. 8, the longitudinal magnetization signal 854 after the pulse train is close to zero. Before the next measurement cycle, i.e., the next series of trains, at the same spatial position starts, the longitudinal magnetization needs to recover to the thermal equilibrium 855, i.e., at or close to 1 for the train depicted.

Figure 9:
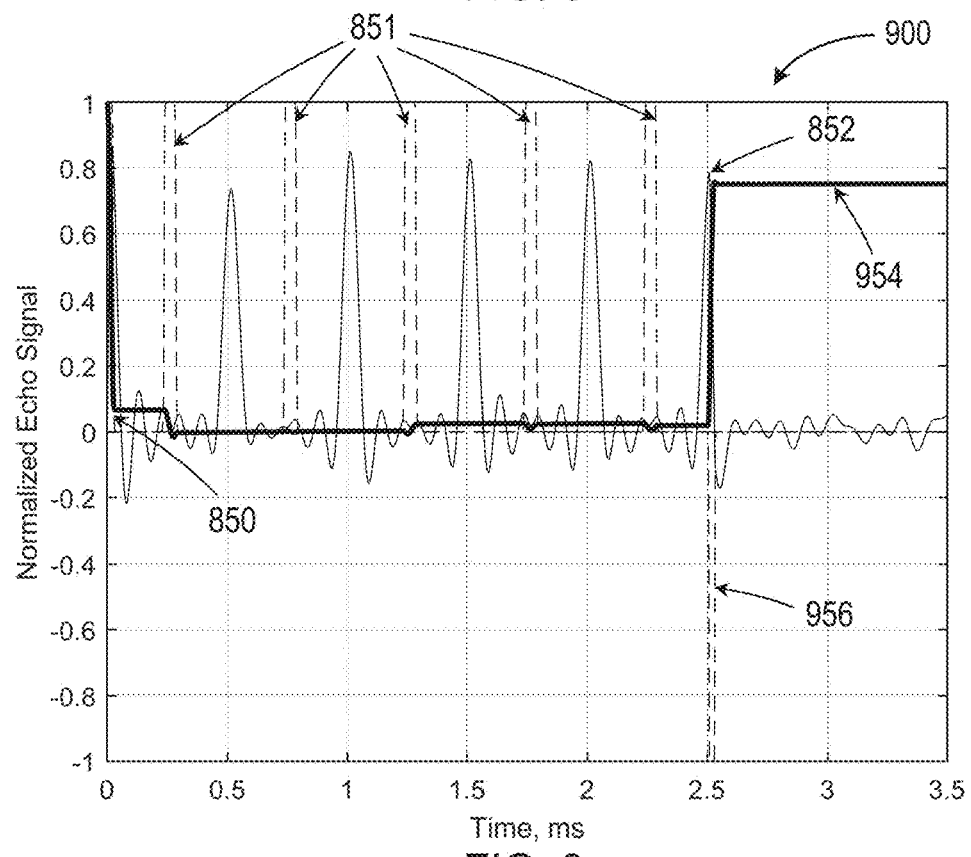
FIG. 9 depicts a numerical simulation of a single NMR echo train having a forced recovery pulse, according to one or more embodiments.

FIG. 9 depicts a numerical simulation of an NMR echo signal for a single short CPMG pulse train 900 having a forced recovery pulse 956, according to one or more embodiments. The pulse train 900 in FIG. 9 has the same excitation pulse 850, five refocusing pulses 851, and resulting spin echo signal 852, but also includes the forced recovery pulse 956. The forced recovery pulse 956 has the same duration and the amplitude as the excitation pulse 850. The forced recovery pulse 956 is applied at the time of the last echo of the spin echo signal 852 and has the phase of its RF carrier opposite to that of the excitation pulse 850. As a result, the longitudinal magnetization lost during pulse train 800 is partly recovered in pulse train 900, as shown by longitudinal magnetization signal 954 compared with the longitudinal magnetization signal 854 in FIG. 8. As depicted, recovery of the longitudinal magnetization signal 954 is about 80%. For a given level of tolerable unrecovered magnetization $\delta$ and a relative magnetization yet to be recovered $\delta_0$ (20% in the case presented in FIG. 9) the waiting time can be expressed by Equation 4 as follows:

$$T_w = T_1 \cdot \ln\left(\frac{\delta_0}{\delta}\right) \quad (4)$$

where $T_1$ is the relaxation time for the longitudinal component of the nuclear magnetization (the slowest expected fraction of the distribution of relaxation times in a sample). For example, when $\delta=5\%$, the waiting times for the pulse train 800 and the forced recovery CPMG train 900 are respectively $3.00 \cdot T_1$ and $1.39 \cdot T_1$. This translates into more than twice the axial resolution of measurements when using the forced recovery CPMG train 900, due to a shorter wait time.

For either the pulse train 800 or the forced recovery CPMG train 900, in order to eliminate measurement artifacts (e.g., undesired ringing) a phase alteration of RF carrier of the excitation pulse 850 can be used in a form of phase alternated pairs of CPMG trains. An implementation of this technique for the azimuthally selective measurements (imaging) requires that both CPMG trains in the phase alternated pair are applied substantially to the same region of formation (the same azimuthal angle). The train pairs 531A/531B, 532A/532B and 533A/533B in FIG. 5 and the train pairs 731A/731B, 732A/732B and 733A/733B in FIG. 7 are examples of the phase alternated pairs.

The flow charts and diagrams are provided to aid in understanding the illustrations and is not to be used to limit scope of the claims. The flowcharts and diagrams depict example operations that can vary within the scope of the claims. Additional operations may be performed; fewer operations may be performed; the operations may be performed in parallel; and the operations may be performed in a different order. For example, the operations depicted in blocks 408 and 410 in the first method 400 can be performed in parallel or concurrently, accounting for wait time, with blocks 608 and 610, as described above. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine-readable media may be utilized. The machine-readable media may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store, a program for use by or in connection with an instruction execution system, apparatus, or device. A machine-readable storage medium is not a machine-readable signal medium.

A machine-readable signal medium may include a propagated data signal with machine-readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing. Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

Figure 10:
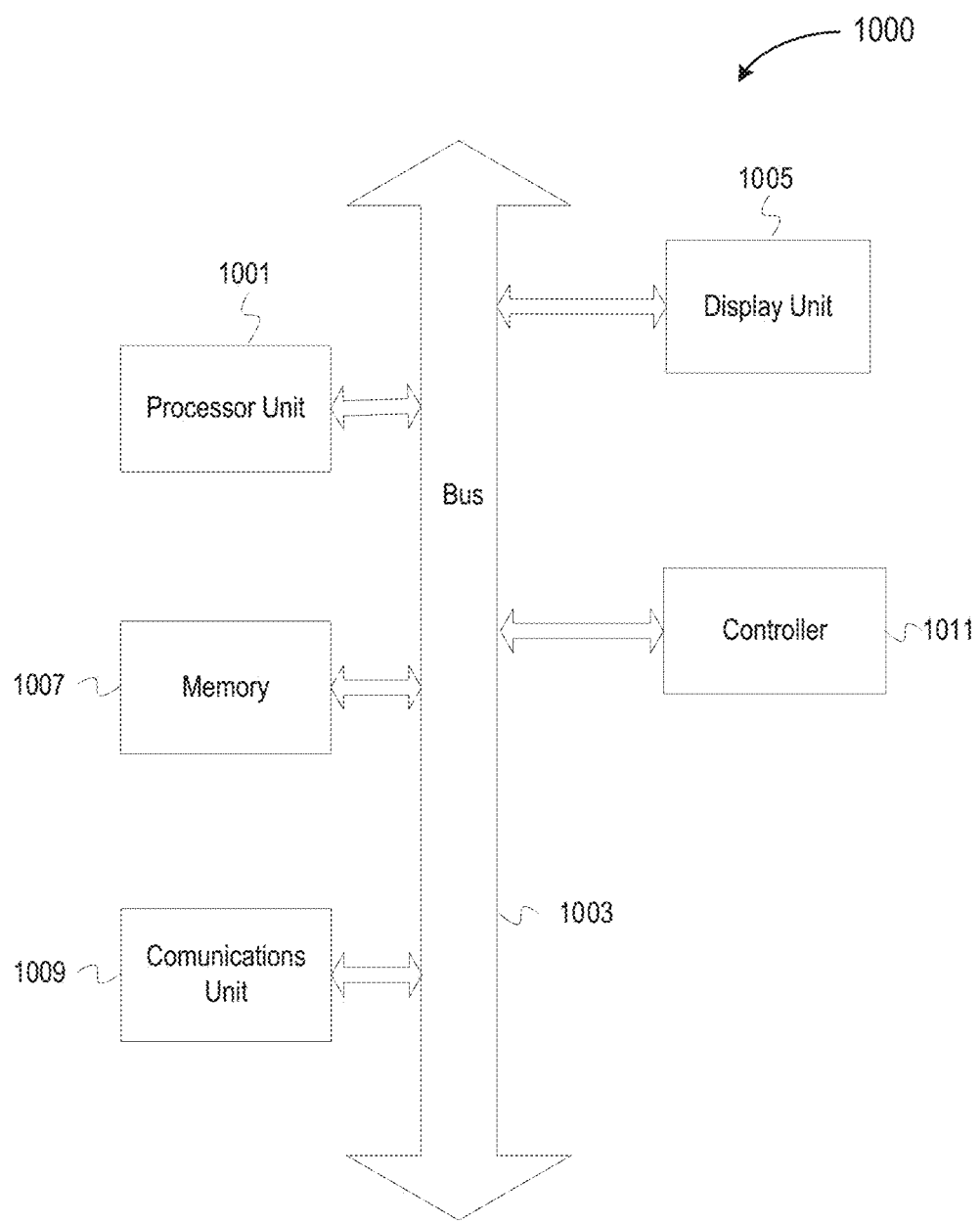
FIG. 10 depicts an example computer system, according to one or more embodiments.

FIG. 10 depicts an example computer system 1000 for use with the NMR sensor 200. The computer system 1000 includes a processor or processor unit 1001 (possibly including multiple processors, multiple cores, multiple nodes, and/or implementing multi-threading, etc.). The computer system includes memory 1007. The memory 1007 may be system memory or any one or more of the above already described possible realizations of machine-readable media. The machine-readable media can have program code executable by the processor unit to cause the NMR sensor 200 to implement any of the methods described above. The computer system 1000 also includes a bus 1003 and a communication unit 1009. The computer system 1000 communicates via transmissions to and/or from remote devices via the communication unit 1009 in accordance with a network protocol corresponding to the type of network interface, whether wired or wireless and depending upon the carrying medium. The communication unit 1009 can include downhole communications in a drilling or logging operation, e.g., in drilling system 100 or logging system 150, and also can include communication to from the surface to the NMR sensor 200 via telemetry or a telemetry module. In addition, a communication or transmission can involve other layers of a communication protocol and or communication protocol suites (e.g., transmission control protocol, Internet Protocol, user datagram protocol, virtual private network protocols, etc.). In one or more embodiments, the computer system 1000 includes a display unit 1005 for displaying one or more measurements of NMR signals and/or NMR pulse trains, as previously described. The system also includes a controller 1011. The controller 1011 can be connected to the NMR sensor 200, particularly the antennas 212 and 214, and can perform tasks to take the NMR measurements via at least one of the antennas 212 and 214 in the manner described in the previous figures. Any one of the previously described functionalities may be partially (or entirely) implemented in hardware and/or on the processor unit 1001. For example, the functionality may be implemented with an application specific integrated circuit, in logic implemented in the processor unit 1001, in a co-processor on a peripheral device or card, etc. Further, realizations may include fewer or additional components not illustrated in FIG. 10 (e.g., video cards, audio cards, additional network interfaces, peripheral devices, etc.). The processor 1001, the display unit 1005, the communication unit 1009, and the controller 1011 are coupled to the bus 1003. Although illustrated as being coupled to the bus 1003, the memory 1007 may alternatively be coupled to the processor unit 1001.

While the aspects of the disclosure are described with reference to various implementations and exploitations, it will be understood that these aspects are illustrative and that the scope of the claims is not limited to them. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

EXAMPLE EMBODIMENTS

Numerous examples are provided herein to enhance understanding of the present disclosure. A specific set of example embodiments are provided as follows:

Example A: A method comprising disposing a nuclear magnetic resonance (NMR) sensor into a borehole, the NMR sensor comprising: a magnet assembly to create a static magnetic field, and a first transversal-dipole antenna having an azimuthally selective response function to generate a radio frequency (RF) magnetic field; and, while rotating the NMR sensor: initiating azimuthally selective NMR excitation in at least one sensitivity region at a first frequency using the first transversal-dipole antenna and the magnet assembly, wherein the at least one sensitivity region is determined by the static magnetic field and the RF magnetic field; and acquiring one or more azimuthally selective NMR signals at the first frequency using the first transversal-dipole antenna.

The method in Example A can further comprise one or more of the following (in any order): (1) generating, after a wait time $T_w$, a second azimuthally selective NMR excitation at the first frequency again using the first transversal-dipole antenna, wherein the wait time $T_w$ is greater than a time needed for nuclear magnetization to recover to its thermal equilibrium; (2) adjusting the wait time $T_w$ based on at least one of an instantaneous angular velocity of rotation of the NMR sensor, an averaged angular velocity of rotation of the NMR sensor, angular position of the NMR sensor, and sequence timing of the azimuthally selective NMR excitation; wherein the azimuthally selective NMR excitation comprises a series of CPMG pulse trains, optionally, wherein at least one of the following (in any order): (A) the azimuthally selective NMR excitation comprises a series of CPMG pulse trains, each pulse train has a train length, and the sequence timing is determined by the train length, a train repetition time, and the number of trains in the series; (B) initiating the azimuthally selective NMR excitation comprises producing an NMR response function in a selected azimuthal aperture, and the train length, the train repetition time, and the number of trains in the series are selected based on the selected azimuthal aperture and rotation of the NMR sensor; (C) the number of trains is based on the average angular velocity of rotation of the NMR sensor; (D) the number of trains corresponds to a number of azimuthally selective regions excited by the first transversal-dipole antenna; or (E) initiating the azimuthally selective NMR excitation at the first frequency comprises generating a CPMG pulse train that includes an excitation pulse and one or more refocusing pulses to produce a spin echo signal and a forced recovery pulse having a same duration and amplitude as the excitation pulse and having a phase of its RF carrier opposite to that of the excitation pulse; (3) initiating azimuthally averaged NMR excitation at a second frequency using a second transversal-dipole antenna, wherein the second transversal-dipole antenna has an axially symmetrical response function; and acquiring an azimuthally averaged NMR signal at the second frequency, and, optionally, wherein the axial symmetric NMR excitation is initiated during the wait time $T_w$; (4) initiating azimuthally selective NMR excitation at a third frequency using the first transversal-dipole antenna; and acquiring one or more azimuthally selective NMR signals at the third frequency using the first transversal-dipole antenna, and, optionally, wherein the azimuthally selective NMR excitation at a third frequency is initiated during a wait time $T_w$, wherein the wait time $T_w$ is greater than a time needed for nuclear magnetization to recover to its thermal equilibrium.

Example B: A nuclear magnetic resonance (NMR) sensor comprising a magnet assembly having a first end piece magnet and a second end piece magnet; and a first transversal-dipole antenna having an azimuthally selective response function.

In one or more embodiments of Example B the NMR sensor can further comprise a second transversal-dipole antenna having axially symmetrical response function, optionally (in any order), (A) wherein the magnet assembly has a central magnet disposed axially between the first end piece magnet and the second end piece magnet, wherein the second transversal-dipole antenna is at least partially disposed circumferentially around the central magnet, wherein the first transversal-dipole antenna and the second transversal-dipole antenna are disposed between the first end piece magnet and the second end piece magnet in axial direction, and wherein the first transversal-dipole antenna and the second transversal-dipole antenna are radially aligned with the central magnet; (B) wherein the second transversal-dipole antenna has a first end and a second end having a length L, wherein the first end and the second end are oriented parallel to an axial direction of the NMR sensor, wherein the first end and the second end are separated by a width W, and wherein the length L is at least 2 times greater than the width W; or (C) wherein the NMR sensor has a circumference, wherein the width W is less than 40% of a length of the circumference.

Example C: A system comprising: a nuclear magnetic resonance (NMR) sensor comprising a magnet assembly to create a static magnetic field and a first transversal-dipole antenna having an azimuthally selective response function to generate a radio frequency (RF) magnetic field; a processor; and one or more machine-readable media having program code executable by the processor to cause the NMR sensor to, initiate azimuthally selective NMR excitation in at least one sensitivity region at a first frequency using the first transversal-dipole antenna and the magnet assembly, wherein the at least one sensitivity region is determined by the static magnetic field and the RF magnetic field; and acquire one or more azimuthally selective NMR signals at the first frequency using the first transversal-dipole antenna.

In one or more embodiments of Example C the machine-readable media can further comprise program code to cause the NMR to (in any order): (1) initiate azimuthally averaged NMR excitation at a second frequency using a second transversal-dipole antenna, wherein the second transversal-dipole antenna has an axially symmetrical response function; and acquire an azimuthally averaged NMR signal at the second frequency; or (2) initiate azimuthally selective NMR excitation at a third frequency using the first transversal-dipole antenna; and acquire one or more azimuthally selective NMR signals at the third frequency using the first transversal-dipole antenna.

What is claimed is:

1. A method comprising:
    disposing a nuclear magnetic resonance (NMR) sensor into a borehole, the NMR sensor comprising:
        a magnet assembly to create a static magnetic field, and
        a first transversal-dipole antenna having an azimuthally selective response function in a selectable azimuthal aperture to generate a radio frequency (RF) magnetic field; and
    while rotating the NMR sensor:
        determining sequence excitation parameters of a first azimuthally selective NMR excitation that include a train length, a train repetition time, and a number of trains, wherein the sequence excitation parameters are selected based on an azimuthal position of the selectable azimuthal aperture and rotation of the NMR sensor;
        initiating the first azimuthally selective NMR excitation in at least one sensitivity region at a first frequency using the selectable azimuthal aperture and the magnet assembly, wherein the at least one sensitivity region is determined by the static magnetic field and the RF magnetic field; and
    acquiring one or more azimuthally selective NMR signals at the first frequency using the selectable azimuthal aperture.

2. The method of claim 1, wherein a wait time is greater than a time for the at least one sensitivity region return to thermal equilibrium.

3. The method of claim 1, wherein the first azimuthally selective NMR excitation comprises a series of CPMG pulse trains, wherein each pulse train has a train length.

4. The method of claim 1, wherein the number of trains is based on an average angular velocity of rotation of the NMR sensor.

5. The method of claim 1, wherein the number of trains corresponds to a number of azimuthally selective regions excited by the first transversal-dipole antenna.

6. The method of claim 1, further comprising:
    initiating an azimuthally averaged NMR excitation at a second frequency using a second transversal-dipole antenna, wherein the second transversal-dipole antenna has an axially symmetrical response function; and
    acquiring an azimuthally averaged NMR signal at the second frequency.

7. The method of claim 6, wherein the azimuthally averaged NMR excitation is initiated during a wait time.

8. The method of claim 1, further comprising:
    initiating the first azimuthally selective NMR excitation at a third frequency using the first transversal-dipole antenna; and acquiring one or more azimuthally selective NMR signals at the third frequency using the first transversal-dipole antenna.

9. The method of claim 8, wherein the first azimuthally selective NMR excitation at a third frequency is initiated during the wait time, wherein the wait time is greater than a time needed for nuclear magnetization to recover to thermal equilibrium.

10. The method of claim 1, wherein initiating the first azimuthally selective NMR excitation at the first frequency comprises generating a CPMG pulse train that includes
an excitation pulse and one or more refocusing pulses to produce a spin echo signal; and
a forced recovery pulse having a same duration and amplitude as the excitation pulse and having a phase of a RF carrier opposite to that of the excitation pulse.

11. A nuclear magnetic resonance (NMR) sensor comprising:
a magnet assembly having a first end piece magnet and a second end piece magnet, wherein the magnet assembly creates a static magnetic field; and
a first transversal-dipole antenna having an azimuthally selective response function in a selectable azimuthal aperture to generate a radio frequency (RF) magnetic field;
the NMR sensor configured to:
determine sequence excitation parameters of a first azimuthally selective NMR excitation that include a train length, a train repetition time, and a number of trains, wherein the sequence excitation parameters are selected based on an azimuthal position of the selectable azimuthal aperture and rotation of the NMR sensor;
initiate the first azimuthally selective NMR excitation in at least one sensitivity region at a first frequency using the selectable azimuthal aperture and the magnet assembly, wherein the at least one sensitivity region is determined by the static magnetic field and the RF magnetic field; and
acquire one or more azimuthally selective NMR signals at the first frequency using the selectable azimuthal aperture.

12. The NMR sensor of claim 11, further comprising a second transversal-dipole antenna having axially symmetrical response function.

13. The NMR sensor of claim 12, wherein the magnet assembly has a central magnet disposed axially between the first end piece magnet and the second end piece magnet,
wherein the second transversal-dipole antenna is at least partially disposed circumferentially around the central magnet,
wherein the first transversal-dipole antenna and the second transversal-dipole antenna are disposed between the first end piece magnet and the second end piece magnet in axial direction, and
wherein the first transversal-dipole antenna and the second transversal-dipole antenna are radially aligned with the central magnet.

14. The NMR sensor of claim 12, wherein the second transversal-dipole antenna has a first end and a second end having a length, wherein the first end and the second end are oriented parallel to an axial direction of the NMR sensor, wherein the first end and the second end are separated by a width, and wherein the length is at least 2 times greater than the width.

15. The NMR sensor of claim 14, wherein the NMR sensor has a circumference, wherein the width is less than 40% of a length of the circumference.

16. A system comprising:
a nuclear magnetic resonance (NMR) sensor comprising:
a magnet assembly to create a static magnetic field, and
a first transversal-dipole antenna having an azimuthally selective response function in a selectable azimuthal aperture to generate a radio frequency (RF) magnetic field;
a processor; and
one or more non-transitory machine-readable media having program code executable by the processor to cause the NMR sensor to:
determine sequence excitation parameters of a first azimuthally selective NMR excitation that include a train length, a train repetition time, and a number of trains, wherein the sequence excitation parameters are selected based on an azimuthal position of the selectable azimuthal aperture and rotation of the NMR sensor;
initiate the first azimuthally selective NMR excitation in at least one sensitivity region at a first frequency using the selectable azimuthal aperture and the magnet assembly, wherein the at least one sensitivity region is determined by the static magnetic field and the RF magnetic field; and
acquire one or more azimuthally selective NMR signals at the first frequency using the selectable azimuthal aperture.

17. The system of claim 16, wherein the one or more machine-readable media also has program code to cause the NMR sensor to:
initiate an azimuthally averaged NMR excitation at a second frequency using a second transversal-dipole antenna, wherein the second transversal-dipole antenna has an axially symmetrical response function; and
acquire an azimuthally averaged NMR signal at the second frequency.

18. The system of claim 16, wherein the one or more machine-readable media also has program code to cause the NMR sensor to:
initiate the first azimuthally selective NMR excitation at a third frequency using the selectable azimuthal aperture; and
acquire one or more azimuthally selective NMR signals at the third frequency using the selectable azimuthal aperture.

19. The method of claim 1 further comprising initiating, after a wait time, a second azimuthally selective NMR excitation at the first frequency using the selectable azimuthal aperture, wherein a length of the wait time is based on at least one of an instantaneous angular velocity of rotation of the NMR sensor, an averaged angular velocity of rotation of the NMR sensor, angular position of the NMR sensor, and sequence timing of the first azimuthally selective NMR excitation.

* * * * *